United States Patent
Ojalvo et al.

(10) Patent No.: US 9,454,429 B2
(45) Date of Patent: Sep. 27, 2016

(54) PROTECTION AGAINST WORD LINE FAILURE IN MEMORY DEVICES

(71) Applicant: Apple Inc., Cupertino, CA (US)

(72) Inventors: Shai Ojalvo, Moshav Olesh (IL); Eyal Gurgi, Petah-Tikva (IL); Micha Anholt, Tel-Aviv (IL)

(73) Assignee: Apple Inc., Cupertino, CA (US)

( * ) Notice: Subject to any disclaimer, the term of this patent is extended or adjusted under 35 U.S.C. 154(b) by 39 days.

(21) Appl. No.: 14/595,578

(22) Filed: Jan. 13, 2015

(65) Prior Publication Data

US 2015/0128010 A1   May 7, 2015

Related U.S. Application Data

(63) Continuation of application No. 13/371,443, filed on Feb. 12, 2012, now Pat. No. 8,949,686.

(60) Provisional application No. 61/442,252, filed on Feb. 13, 2011.

(51) Int. Cl.
| | | |
|---|---|---|
| *G06F 11/10* | (2006.01) | |
| *G11C 29/00* | (2006.01) | |
| *H03M 13/00* | (2006.01) | |
| *G11C 7/10* | (2006.01) | |
| *G11C 5/00* | (2006.01) | |

(52) U.S. Cl.
CPC ....... *G06F 11/1016* (2013.01); *G06F 11/1004* (2013.01); *G06F 11/108* (2013.01); *G06F 11/1044* (2013.01); *G11C 7/1006* (2013.01); *G11C 5/005* (2013.01); *G11C 2207/104* (2013.01)

(58) Field of Classification Search
CPC ............... G11C 13/0069; G11C 2207/104; G11C 5/005; G11C 7/1006; G06F 11/1004; G06F 11/1016; G06F 11/1044; G06F 11/108
See application file for complete search history.

(56) References Cited

U.S. PATENT DOCUMENTS

| | | | |
|---|---|---|---|
| 7,739,576 B2 | 6/2010 | Radke | |
| 8,041,884 B2 | 10/2011 | Chang | |
| 8,135,935 B2 | 3/2012 | Haertel et al. | |
| 8,239,734 B1 | 8/2012 | Shalvi | |
| 8,332,345 B1 * | 12/2012 | Murphy | G06N 5/02 706/50 |
| 8,386,905 B2 | 2/2013 | Chu | |
| 8,495,465 B1 | 7/2013 | Anholt et al. | |
| 8,634,240 B2 | 1/2014 | Gavens et al. | |
| 8,700,555 B1 * | 4/2014 | Murphy | G06N 5/02 706/50 |
| 8,700,951 B1 * | 4/2014 | Call | G06F 11/1441 714/22 |
| 8,780,620 B2 * | 7/2014 | Jiang | G11C 11/5678 365/148 |
| 2010/0169743 A1 * | 7/2010 | Vogan | G06F 11/1048 714/773 |
| 2011/0149651 A1 | 6/2011 | Gorobets et al. | |
| 2012/0254694 A1 | 10/2012 | Golov et al. | |

\* cited by examiner

*Primary Examiner* — Phung M Chung (74) *Attorney, Agent, or Firm* — Meyertons, Hood, Kivlin, Kowert & Goetzel, P.C.

(57) ABSTRACT

A method for data storage includes providing a mapping of data pages to physical pages, in which each physical page holds a non-integer number of the data pages, for storage of data in at least one memory block, including a plurality of the physical pages, in a memory device. The data pages that are mapped to the memory block are partitioned into groups, such that failure of any memory unit, which consists of a predefined number of the physical pages in the memory device, will produce errors in no more than one data page in each group. The data pages is stored in the physical pages of the memory block in accordance with the mapping, while a redundant storage scheme is applied among the data pages of each group.

20 Claims, 5 Drawing Sheets

PROTECTION AGAINST WORD LINE FAILURE IN MEMORY DEVICES

CROSS-REFERENCE TO RELATED APPLICATIONS

This application is a continuation of U.S. patent application Ser. No. 13/371,443, now U.S. Pat. No. 8,949,686, entitled "Protection Against Word Line Failure in Memory Devices", filed Feb. 12, 2012, and claims the benefit of U.S. Provisional Patent Application 61/442,252, filed Feb. 13, 2011, whose disclosure is incorporated herein by reference.

TECHNICAL FIELD

Embodiments described herein are related to the field of data storage, and particularly to methods and systems for protection against failures in memory devices.

BACKGROUND

Various techniques are known in the art for protecting data stored in memory against failures. For example, U.S. Patent Application Publication 2010/0017650, whose disclosure is incorporated herein by reference, describes a non-volatile memory data storage system, which includes a host interface for communicating with an external host, and a main storage including a first plurality of Flash memory devices. Each memory device includes a second plurality of memory blocks. A third plurality of first stage controllers are coupled to the first plurality of Flash memory devices. A second stage controller is coupled to the host interface and the third plurality of first stage controller through an internal interface. The second stage controller is configured to perform Redundant Array of Independent Disks (RAID) operation for data recovery according to at least one parity.

As another example, U.S. Patent Application Publication 2009/0204872, whose disclosure is incorporated herein by reference, describes a Flash module having raw-NAND Flash memory chips accessed over a Physical-Block Address (PBA) bus by a controller. The controller converts logical block addresses to physical block addresses. In some embodiments, data can be arranged to provide redundant storage, which is similar to a RAID system, in order to improve system reliability.

SUMMARY

An embodiment that is described herein provides a method for data storage. The method includes providing a mapping of data pages to physical pages, in which each physical page holds a non-integer number of the data pages, for storage of data in at least one memory block, including a plurality of the physical pages, in a memory device. The data pages that are mapped to the memory block are partitioned into groups, such that failure of any memory unit, which consists of a predefined number of the physical pages in the memory device, will produce errors in no more than one data page in each group. The data pages is stored in the physical pages of the memory block in accordance with the mapping, while a redundant storage scheme is applied among the data pages of each group.

In some embodiments, partitioning the data pages includes causing any two data pages containing the errors caused by the failure to fall in different groups. In an embodiment, the memory unit includes a word line in the memory block. In a disclosed embodiment, storing the data pages includes encoding each of the data pages individually with an Error Correction Code (ECC).

In an embodiment, applying the redundant storage scheme includes producing one of the data pages in a given group by calculating a bit-wise exclusive-OR between remaining data pages in the given group. In another embodiment, applying the redundant storage scheme includes producing one of the data pages in a given group by calculating a bit-wise Forward Error Correction (FEC) code between remaining data pages in the given group.

In yet another embodiment, storing the data pages is performed by a memory controller that is connected to the memory device, and applying the redundant storage scheme is performed by a host that is connected to the memory controller. In still another embodiment, storing the data pages and applying the redundant storage scheme are performed jointly by a memory controller and a host, and the method includes reporting partitioning of the data pages into the groups between the memory controller and the host.

There is additionally provided, in accordance with another embodiment, a data storage apparatus including an interface and at least one processor. The interface is configured to send data for storage in a memory device that includes at least one memory block including multiple physical pages. The at least one processor is configured to hold a mapping of data pages to the physical pages in which each physical page holds a non-integer number of the data pages, to partition the data pages that are mapped to the memory block into groups, such that failure of any memory unit, which consists of a predefined number of the physical pages in the memory device, will produce errors in no more than one data page in each group, and to store the data pages in the physical pages of the memory block in accordance with the mapping, while applying a redundant storage scheme among the data pages of each group.

There is also provided, in accordance with an embodiment, a data storage apparatus including a memory device and at least one processor. The memory device includes at least one memory block including multiple physical pages. The at least one processor is configured to hold a mapping of data pages to the physical pages in which each physical page holds a non-integer number of the data pages, to partition the data pages that are mapped to the memory block into groups, such that failure of any memory unit, which consists of a predefined number of the physical pages in the memory device, will produce errors in no more than one data page in each group, and to store the data pages in the physical pages of the memory block in accordance with the mapping, while applying a redundant storage scheme among the data pages of each group.

The embodiments will be more fully understood from the following detailed description of the embodiments thereof, taken together with the drawings in which:

DETAILED DESCRIPTION OF EMBODIMENTS

Overview

Embodiments that are described herein provide improved methods and systems for protecting data that is stored in memory devices, such as Flash devices, against memory failures. The embodiments described herein refer mainly to failure of a word line (a row of memory cells) within a memory block, but the disclosed techniques are also useful for overcoming failures of other kinds of memory units within a memory block.

In the disclosed embodiments, each memory block comprises multiple physical pages for storing data. Some configurations store one physical page per word line. Other configurations store two pages per word line, one in the odd-order memory cells and another in the even-order memory cells. A processor (e.g., memory controller or host) sends data pages for storage in a memory block. Each data page is typically encoded individually by the processor with an Error Correction Code (ECC). Each data page is mapped to a certain location in the physical pages of the memory block, but the data pages are different in size from the physical pages—Each physical page comprises a non-integer number of data pages. Thus, a given data page may be split among two or more physical pages.

In a configuration of this sort, failure of a word line may affect two or more of the data pages. In particular, when each data page comprises an ECC frame, failure of a word line may cause errors in multiple ECC frames. Conventional redundancy schemes (e.g., RAID) among the data pages will not perform well in this situation.

In some embodiments, the processor overcomes word line failures by partitioning the data pages that are mapped to the memory block into groups (referred to as "parity groups"). The partitioning is defined such that failure of a word line will not cause errors in more than a single data page in each group. Put in another way, the partitioning is defined such that any two data pages that contain errors due to the word line failures fall in different groups.

The processor then stores the data while applying a redundant storage scheme (e.g., RAID) among the data pages of each group. Since the partitioning of the data pages guarantees that each group will have a maximum of one failed data page per group following word line failure, the redundant storage scheme within each group is able to recover any lost data page from the remaining data pages in the group. An example method for partitioning the data pages into parity groups, based on the mapping of data pages to physical pages, is described herein.

The methods and systems described herein are highly efficient in protecting data against failures of word lines, pairs of word lines or other kinds of data units within a memory block. These techniques generate only modest amounts of redundancy information, and are particularly suitable for memory configurations in which each physical page holds a non-integer number of data pages.

System Description

Figure 1:
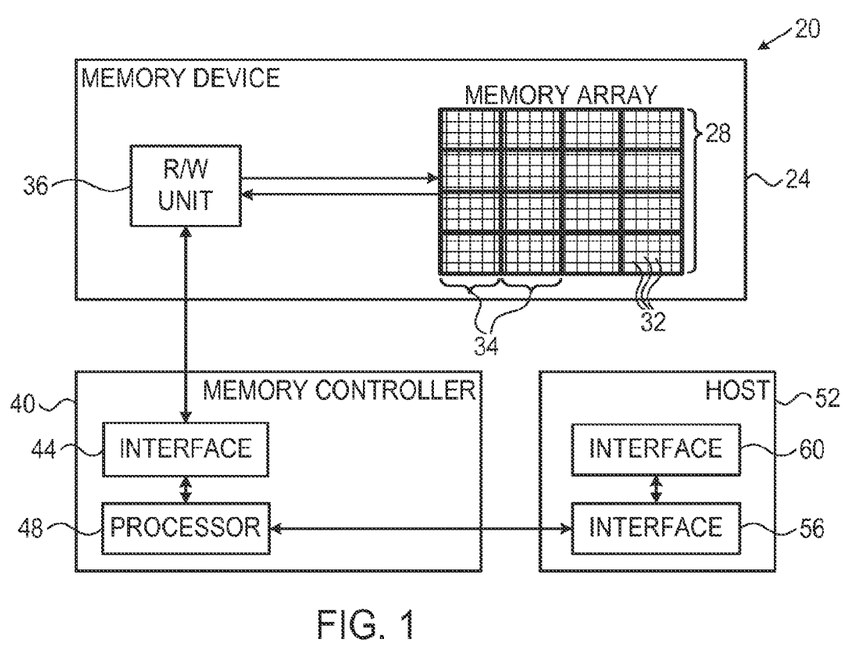
FIG. 1 is a block diagram that schematically illustrates a memory system, in accordance with an embodiment.

FIG. 1 is a block diagram that schematically illustrates a memory system 20, in accordance with an embodiment. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. In some embodiments, processor 48 encodes the data to be stored with an Error Correction Code (ECC).

Memory controller 40 communicates with a host 52, for accepting data for storage in the memory device and for outputting data retrieved from the memory device. Host 52 comprises an interface 56 for communicating with memory controller 40, and a processor 60 that carries out the various host functions.

Memory controller 40 and/or host 52, and in particular processors 48 and/or 60, may be implemented in hardware. Alternatively, the memory controller and/or host may comprise one or more microprocessors that run suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the embodiments, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by processor 60 or other element of host 52. In some embodiments, host 52 and memory controller 40 may be fabricated on the same die, or on separate dies in the same device package.

In some embodiments, processor 48 and/or processor 60 comprise general-purpose processors, which are programmed in software to carry out the functions described herein. The software may be downloaded to the processors in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple physical pages, i.e., groups of memory cells that are programmed and read simultaneously. Physical pages are sometimes sub-divided into sectors. In some embodiments, each physical page occupies an entire row of the array. In alternative embodiments, each row (word line) can be divided into two or more physical pages. For example, in some devices each row is divided into two physical pages, one comprising the odd-order cells and the other comprising the even-order cells.

Typically, memory controller 40 programs data in physical page units, but erases entire memory blocks 34. Typically although not necessarily, a memory block is on the order of $10^6$ memory cells, whereas a page is on the order of $10^3$-$10^4$ memory cells.

In some embodiments, memory device 24 comprises multiple separate memory arrays that are operated in parallel, for example in order to increase the speed of memory access operations. The separate arrays are commonly referred to as memory planes. In an embodiment, device 24 supports multi-plane read and write commands, which perform reading and writing of multiple pages to multiple memory planes in parallel.

Mapping of Data Pages to Physical Pages

In some embodiments, each memory block in device 24 comprises multiple physical pages that are used for storing data. Each physical page is made-up of multiple memory cells 32 along a certain word line. In some embodiments each physical page occupies an entire respective word line. In other embodiments, each word line holds multiple physical pages, e.g., one physical page in the odd-order cells and another physical page in the even-order cells.

Memory controller 40, on the other hand, writes and reads data in device 24 in data pages. Typically, the memory controller encodes each data page separately with an ECC. The data pages are therefore also referred to as ECC frames, and the two terms are used interchangeably herein.

(The techniques described herein can be carried out by processor 48 of memory controller 40, by processor 60 of host 52, or by both processors together. The disclosed techniques can be partitioned between processors 48 and 60 in any suitable way. Thus, processors 48 and 60 are referred to herein collectively as a processor that carries out the disclosed techniques. Examples for possible tasks of each of processors 48 and 60, and possible interactions between them, are addressed further below.)

In the embodiments described herein, each physical page holds a non-integer number of ECC frames according to a predefined mapping. In an example embodiment, every two physical pages hold three ECC frames. Typically, although not necessarily, most of the physical pages hold entire ECC frames, so that these ECC frames can be read or written in a single read or write command. When an ECC frame is split over more than one physical page, the ECC frame is read or written using multiple read or write commands.

Figure 2:
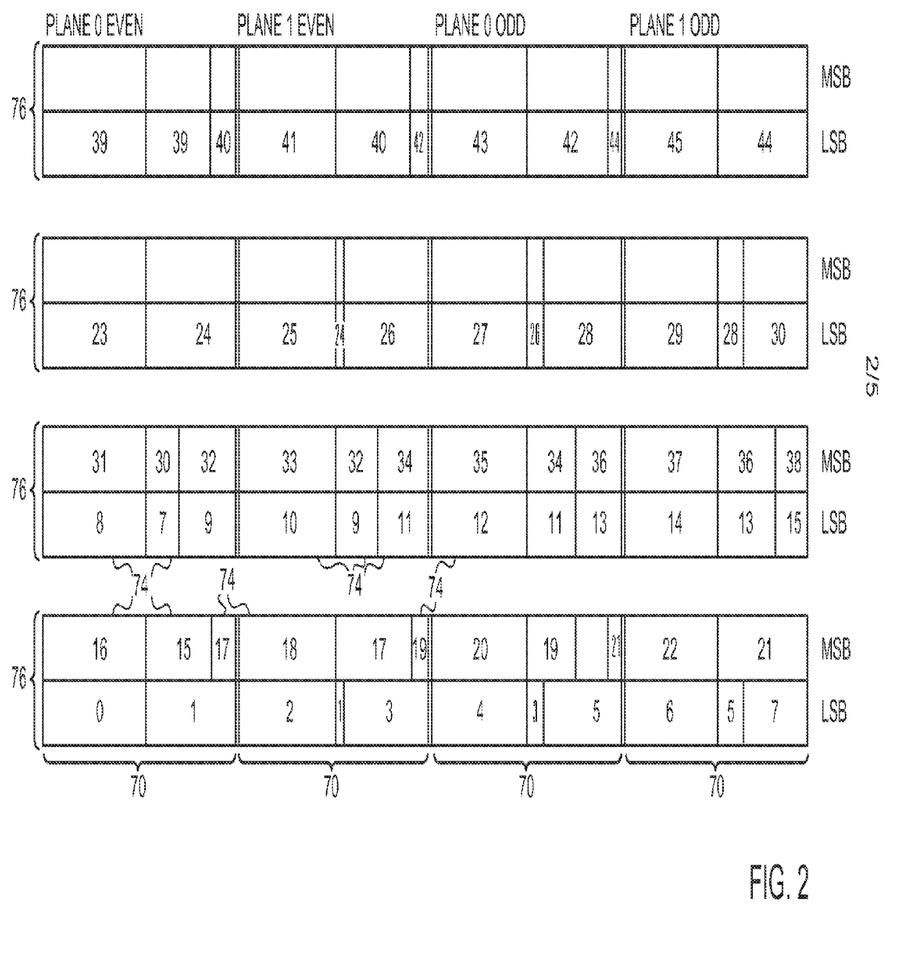
FIG. 2 is a diagram that schematically illustrates a mapping of Error Correction Code (ECC) frames to physical pages of a memory, in accordance with an embodiment.

FIG. 2 is a diagram that schematically illustrates a mapping of ECC frames to physical pages, in accordance with an embodiment. In the present example, memory device comprises 2 bits/cell memory cells arranged in two memory planes denoted plane 0 and plane 1. Each plane comprises multiple memory blocks, each comprising multiple word lines 76. Each memory block comprises four physical pages 70 per word line 76: Two physical pages (denoted LSB and MSB) in the odd-order memory cells and two physical pages (denoted LSB and MSB) in the even-order memory cells. This configuration, however, is chosen purely by way of example. In alternative embodiments, and other suitable configuration can be used.

The processor typically stores ECC frames 74 in physical pages 70. For a given memory block, the processor holds a predefined mapping of ECC frames to physical pages. FIG. 2 shows one example of such a mapping, for a pair of corresponding memory blocks in plane 0 and plane 1 (which may also be referred to as a single multi-plane block). ECC frames 74 are numbered 0-45 in the figure.

As can be seen in the figure, ECC frames 74 are smaller than physical pages 70, and each physical page 70 holds a non-integer number of ECC frames 74. Some ECC frames are stored contiguously in a single physical page, such as the ECC frames numbered 0, 2 and 4. Other ECC frames are split over more than one physical page, such as the ECC frames numbered 1, 3 and 5. Thus, some physical pages 70 comprise data from more than one ECC frame 74.

Mitigating the Effect of Word Line Failure by Partitioning the ECC Frames into Parity Groups In a configuration such as the configuration of FIG. 2, failure of a word line 76 will typically cause errors in multiple ECC frames. In such an event, there is high likelihood that the processor will fail to decode the ECC in these multiple ECC frames. Therefore, a conventional redundant storage scheme, such as RAID, among the ECC frames of the block will typically not protect against word line failure.

In some embodiments, the processor overcomes word line failures by implementing the redundant storage scheme separately in groups of ECC frames that are referred to as parity groups. The processor partitions the ECC frames in the block into groups, such that failure of a word line will not cause errors in more than a single ECC frame in each group. In other words, the partitioning is defined such that any two ECC frames that contain errors due to the word line failures fall in different parity groups. Typically, the partitioning depends on the kind of memory unit whose failure is to be mitigated, and on the mapping of ECC frames to physical pages.

Within each parity group, the processor stores the data while applying a redundant storage scheme such as RAID. In an example embodiment, each parity group comprises N ECC frames. The processor produces N−1 ECC frames (referred to as "data ECC frames") that contain the data to be stored. The processor calculates a bit-wise exclusive-OR (XOR) between the N−1 data ECC frames, so as to produce an $N^{th}$ ECC frame (referred to as "parity ECC frame"). The processor stores these ECC frames (N−1 data ECC frames and one parity ECC frame) in the N ECC frames of the group.

This sort of process is typically performed separately in each parity group. In alternative embodiments, the processor may apply any other suitable redundant storage scheme among the ECC frames of each group. Since, as explained above, the partitioning into parity groups ensures that each group will contain a maximum of one failed ECC frame per group following word line failure, the processor is able to recover any lost ECC frame from the remaining ECC frames in the group using the redundant storage scheme.

Figure 3:
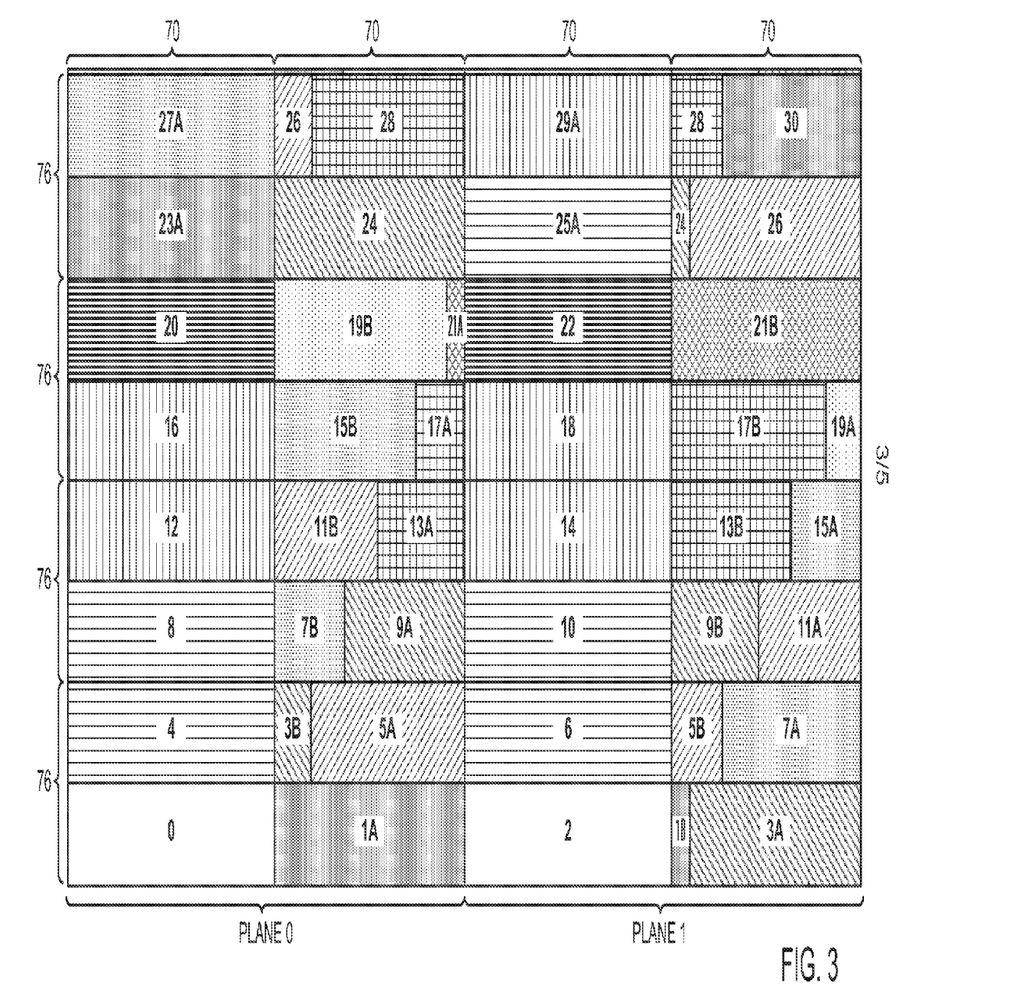
FIG. 3 is a diagram that schematically illustrates a partitioning of ECC frames into parity groups, in accordance with an embodiment.

FIG. 3 is a diagram that schematically illustrates a partitioning of ECC frames into parity groups, in accordance with an embodiment. The example of FIG. 3 shows a pair of corresponding memory blocks in plane 0 and plane 1, each comprising multiple word lines 76 holding physical pages 70. The ECC frames stored in the pair of blocks are numbered 0-30. When a certain ECC frame is split over two physical pages, the two parts of the ECC frame are marked with the letters a and b, e.g., 5a and 5b.

The ECC frames in each parity group are marked in the figure with a different pattern. For example, ECC frames 13, 17 and 28 belong to the same parity group. ECC frames 1, 23 and 30 belong to another parity group. As can be seen in the figure, any failure of a single word line 76 will cause errors in at most one ECC frame per group.

The partitioning shown in FIG. 3 is an example partitioning. In alternative embodiments, any other suitable partitioning can be used. The partitioning into parity groups is typically defined a-priori and provided to the processor.

The partitioning of the ECC frames mapped to a memory block into parity groups can be defined using any suitable method. In one embodiment, the partitioning is performed using the following process:

Determine the number of ECC frames (including both data and parity ECC frames) that are mapped to the block (or multi-plane block).

Define the failure mode that is to be mitigated (e.g., word line failure).

Determine which ECC frames are not permitted to belong to the same parity group as they are affected by the same failure.

Create a graph in which each vertex represents a respective ECC frame and an edge exists between any pair of vertices corresponding to a pair of ECC frames that cannot belong to the same parity group.

Use a graph coloring algorithm to find a coloring scheme that can be used to color the graph such that no two vertices of the same color are connected by an arc. Typically, find a coloring scheme having a minimum number of colors.

Each parity group corresponds to a color. In other words, the ECC frames of each parity group correspond to vertices of the same color. One of the ECC frames in each group (e.g., the last ECC frame) comprises the parity ECC frame of the group.

Figure 4:
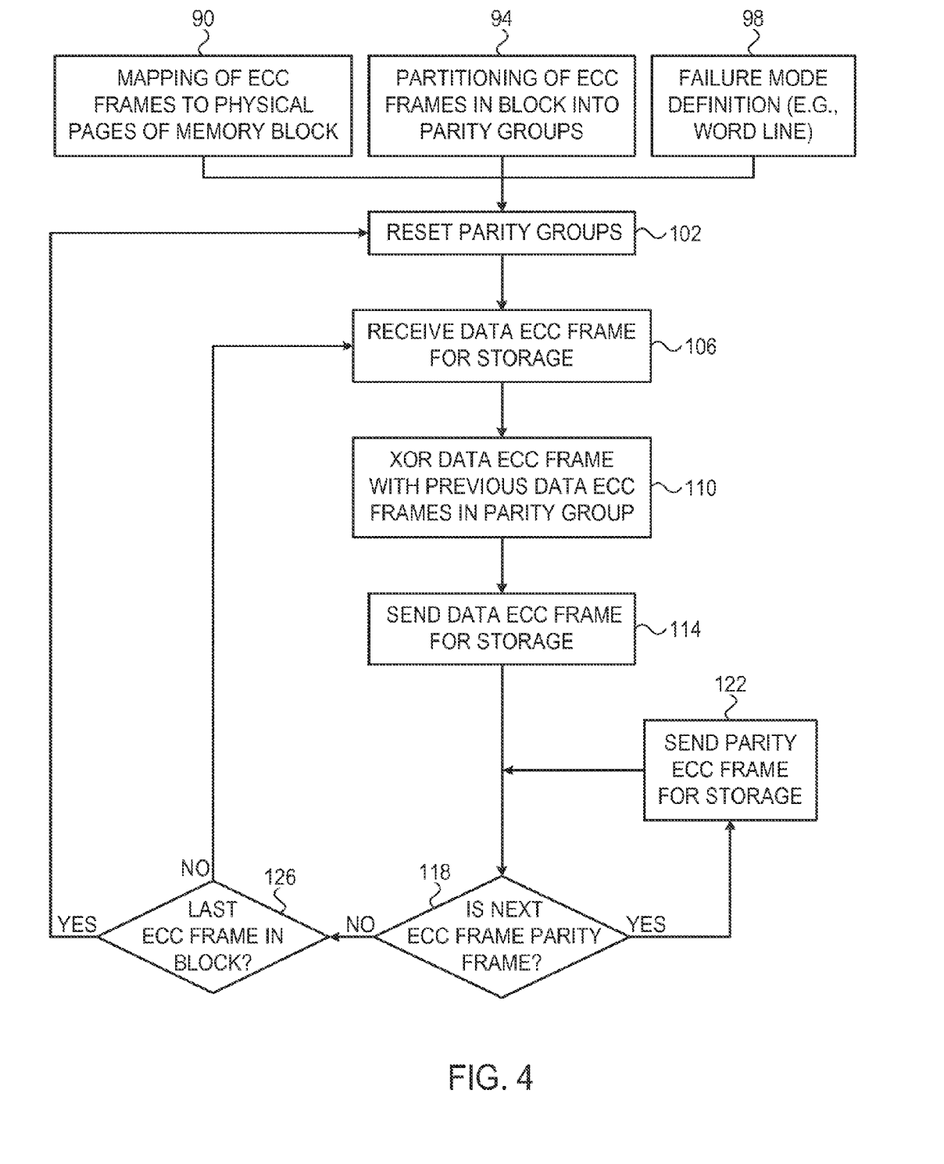
FIG. 4 is a flow chart that schematically illustrates a method for data storage, in accordance with an embodiment.

FIG. 4 is a flow chart that schematically illustrates a method for data storage, in accordance with an embodiment. The method begins with configuring the processor with three definitions: A mapping of ECC frames to physical pages in a memory block, at a mapping definition step 90; a partitioning of the ECC frames in the memory block into parity groups, at a partitioning definition step 94; and a definition of the memory units (e.g., word lines) whose failure is to be mitigated, at a failure mode definition step 98.

The processor initially resets the parity groups for the block, at a reset step 102. The processor receives a data ECC frame for storage, at a data input step 106. According to the partitioning (step 94), the data ECC frame belongs to a certain parity group. The processor XORs the data ECC frame with the previous data ECC frames in the same parity group (typically with the current parity ECC frame), at a XOR step 110. The processor sends the data ECC frame for storage in the appropriate physical page or pages (according to the mapping of step 90), at a data storage step 114.

The processor checks whether the next ECC frame is a parity ECC frame, at a parity checking step 118. If the next ECC frame is a parity ECC frame, the processor sends the parity ECC frame for storage in the appropriate physical page or pages (according to the mapping of step 90), at a parity storage step 122. The method then loops back to step 118.

If, on the other hand, the next ECC frame is a data ECC frame, the processor checks whether the current ECC frame is the last ECC frame to be stored in the block, at a completion checking step 126. If so, the method loops back to step 102 for initiating storage in another block. If not, the method loops back to step 106 above for receiving the next data ECC frame.

Figure 5:
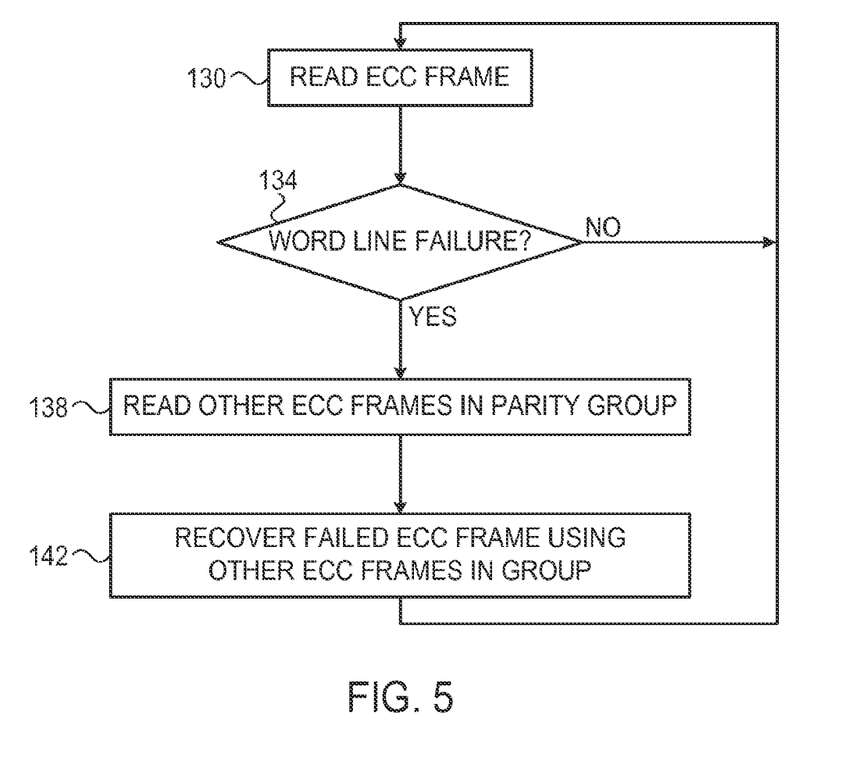
FIG. 5 is a flow chart that schematically illustrates a method for data readout, in accordance with an embodiment.

FIG. 5 is a flow chart that schematically illustrates a method for data readout, in accordance with an embodiment. This method can be used for reading the data that was stored in device 24 by the method of FIG. 4. The method of FIG. 4 begins with the processor reading an ECC frame, at a readout step 130. The processor checks whether the read ECC frame contains errors due to word line failure, at a failure checking step 134. If not, the method loops back to step 130 for reading the next ECC frame.

If the ECC frame read at step 130 contains errors due to word line failure, the processor reads the remaining N−1 ECC frames in the same parity group as the failed ECC frame, at a group readout step 138. The processor then recovers the data of the failed ECC frame from the N−1 other ECC frames, at a recovery step 142.

In some embodiments, the disclosed techniques can be carried out for a set of memory blocks instead of over a single memory block. This technique reduces the amount of parity overhead, but typically involves erasing the set of memory blocks together.

The embodiments described above refer mainly to a redundant storage scheme that is able to correct a single erasure (a single failed ECC frame out of the N ECC frames in the parity group). In alternative embodiments, other suitable redundant storage schemes can be used. For example, the processor may apply a Hamming code, in a bit-wise manner, to corresponding bits of the data ECC frames. Since a Hamming code is able to correct more than a single erasure, such a scheme can recover from more than a single failed ECC frame per group. This technique may reduce the number of parity groups and simplify the partitioning of ECC frames into groups. Alternatively to a Hamming code, any other suitable Forward Error Correction (FEC) code can be used for this purpose.

When using the methods and systems described herein, the ECC used in each ECC frame can be designed with less redundancy, since some resilience to errors is provided by the redundant storage scheme between ECC frames. In some embodiments, the ECC can be designed such that the limiting factor is two ECC failures in a block instead of one. For example, if the ECC is expected to provide an average failure rate of one failure every $10^{11}$ ECC frames, when using the disclosed techniques the ECC can be designed for an average failure rate of two failures per $10^{11}$ ECC frames.

Interaction Between Host and Memory Controller

In various embodiments, tasks can be divided in various ways between processor 48 of memory controller 40 and processor 60 of host 52. For example, in some embodiments the memory controller has less memory and computational resources than the host. In some embodiments, processor 60 is requested by processor 48 to perform the parity calculations (e.g., XOR operations) for producing the parity ECC frames and/or for recovering a failed ECC frame from the other ECC frames in the parity group. In these embodiments, ECC encoding and decoding is typically performed in the memory controller, but parity calculations between ECC frames is performed in the host. Alternatively, the memory controller may perform the parity calculations between ECC frames with degraded performance, e.g., with higher latency. The memory controller may send intermediate results for storage in the host memory.

In the embodiments described above, the partitioning of the ECC frames into parity groups is defined in advance and provided to the memory controller. In some embodiments, the host is not a-priori aware of the partitioning. In these embodiments, the host may be notified by the memory controller of the partitioning into groups. The command interface between the host and the memory controller may comprise commands for requesting and reporting the group partitioning or parts thereof.

Although the embodiments described herein mainly address mitigation of word line failures, the methods and systems described herein can also be used for mitigating failures of other memory units within a memory block, such as failure of a pair of word lines (e.g., when a short circuit is formed between two word lines), failure of half of a word line (e.g., of the odd-order cells or even-order cells), or any other suitable memory unit.

It will thus be appreciated that the embodiments described above are cited by way of example, and that the scope of the present disclosure is not limited to what has been particularly shown and described hereinabove. Rather, the scope of the present disclosure includes both combinations and subcombinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
an interface configured to send a plurality of data pages for storage in a memory device, wherein the memory device includes a plurality of blocks, and wherein each block of the plurality of blocks includes a plurality of rows of data storage cells; and
at least one processor configured to:
determine, for the plurality of data pages, a portion of the plurality of data pages to be mapped to a given block of the plurality of blocks of the memory device;
determine, for a particular failure mechanism of the given block of the plurality of blocks, a subset of the portion of the plurality of data pages, wherein each data page of the subset of the portion of the plurality of data pages is affected by the particular failure mechanism;
create a graph that includes a plurality of vertices and a plurality of edges;
wherein each vertex of the plurality of vertices corresponds to a respective data page of the plurality of data pages;
wherein each edge of the plurality of edges connects a first vertex of the plurality of vertices and a second vertex of the plurality of vertices, and wherein the first vertex corresponding to a first data page of the subset of the portion of the plurality of data pages, and the second vertex corresponding to a second data page of the plurality of data pages not included in the subset of the portion of the plurality of data pages; and
assign a given color of a plurality of colors to each vertex of the plurality of vertices such that no two vertices connected by a given edge of the plurality of edges have the same color, wherein each color of the plurality of colors corresponds to a respective group of a plurality of groups.

2. The apparatus of claim 1, wherein the at least one processor is further configured to partition the portion of the plurality of data pages into the plurality of groups.

3. The apparatus of claim 2, wherein the at least one processor is further configured to generate, for a given group of the plurality of groups, a respective parity page of a plurality of parity pages dependent upon the data pages included in the given group of the plurality of groups.

4. The apparatus of claim 3, wherein the at least one processor is further configured to store each data page of the portion of the plurality of data pages in the given block of the plurality of blocks dependent upon a mapping of the plurality of data pages to the plurality of rows of data storage cells for the given block of the plurality of blocks.

5. The apparatus of claim 4, wherein the at least one processor is further configured to store each parity page of the plurality of parity pages in the given block of the plurality of blocks dependent upon the mapping.

6. The apparatus of claim 1, wherein each data page of the plurality of data pages is encoded with an Error Correction Code (ECC).

7. A method, comprising:
receiving a plurality of data pages for storage in a memory device, wherein the memory device includes a plurality of blocks, and wherein each block of the plurality of blocks includes a plurality of rows of data storage cells;

determining, for the plurality of data pages, a portion of the plurality of data pages to be mapped to a given block of the plurality of blocks of the memory device;

determining, for a particular failure mechanism of the given block of the plurality of blocks, a subset of the portion of the plurality of data pages, wherein each data page of the subset of the portion of the plurality of data pages is affected by the particular failure mechanism;

creating a graph that includes a plurality of vertices and a plurality of edges;

wherein each vertex of the plurality of vertices corresponds to a respective data page of the plurality of data pages;

wherein each edge of the plurality of edges connects a first vertex of the plurality of vertices and a second vertex of the plurality of vertices, wherein the first vertex corresponds to a first data page of the subset of the portion of the plurality of data pages, and the second vertex corresponding to a second data page of the plurality of data pages not included in the subset of the portion of the plurality of data pages; and assigning a given color of a plurality of colors to each vertex of the plurality of vertices such that no two vertices connected by a given edge of the plurality of edges have the same color, wherein each color of the plurality of colors corresponds to a respective group of a plurality of groups.

8. The method of claim 7, further comprising partitioning the portion of the plurality of data pages into the plurality of group.

9. The method of claim 8, further comprising generating, for a given group of the plurality of groups, a respective parity page of a plurality of parity pages dependent upon the data pages included in the given group of the plurality of groups.

10. The method of claim 9, further comprising storing each data page of the portion of the plurality of data pages in the given block of the plurality of blocks dependent upon a mapping of the plurality of data pages to the plurality of rows of data storage cells for the given block of the plurality of blocks.

11. The method of claim 10, further comprising storing each parity page of the plurality of parity pages in the given block of the plurality of blocks dependent upon the mapping.

12. The method of claim 10, wherein storing each data page of the portion of the plurality of data pages is performed by a memory controller coupled to the memory device.

13. The method of claim 7, wherein each data page of the plurality of data pages is encoded with an Error Correction Code (ECC).

14. A system, comprising:
a memory device, wherein the memory device includes a plurality of blocks, and wherein each block of the plurality of blocks includes a plurality of rows of data storage cells; and a processor configured to:
receive a plurality of data pages for storage in the memory device, wherein the memory device includes a plurality of blocks, and wherein each block of the plurality of blocks includes a plurality of rows of data storage cells;

determine, for the plurality of data pages, a portion of the plurality of data pages to be mapped to a given block of the plurality of blocks of a memory device;

determine, for a particular failure mechanism of the given block of the plurality of blocks, a subset of the portion of the plurality of data pages, wherein each data page of the subset of the portion of the plurality of data pages is affected by the particular failure mechanism;

create a graph that includes a plurality of vertices and a plurality of edges wherein each vertex of the plurality of vertices corresponds to a respective data page of the plurality of data pages;

wherein each edge of the plurality of edges connects a first vertex of the plurality of vertices and a second vertex of the plurality of vertices and wherein the first vertex corresponding to a first data page of the subset of the portion of the plurality of data pages, and the second vertex corresponding to a second data page of the plurality of data pages not included in the subset of the portion of the plurality of data pages; and assign a given color of a plurality of colors to each vertex of the plurality of vertices such that no two vertices connected by a given edge of the plurality of edges have the same color, wherein each color of the plurality of colors corresponds to a respective group of a plurality of groups.

15. The system of claim 14, wherein the processor is further configured to partition the portion of the plurality of data pages into the plurality of group.

16. The system of claim 15, wherein the processor is further configured to generate, for a given group of the plurality of groups, a respective parity page of a plurality of parity pages dependent upon the data pages included in the given group of the plurality of groups.

17. The system of claim 16, wherein the processor is further configured to store each data page of the portion of the plurality of data pages in the given block of the plurality of blocks dependent upon a mapping of the plurality of data pages to the plurality of rows of data storage cells for the given block of the plurality of blocks.

18. The system of claim 17, wherein the processor is further configured to store each parity page of the plurality of parity pages in the given block of the plurality of blocks dependent upon the mapping.

19. The system of claim 14, wherein the processor comprises a memory controller coupled to the memory device.

20. The system of claim 14, wherein each data page of the plurality of data pages is encoded with an Error Correction Code (ECC).

* * * * *